United States Patent
Chen et al.

(10) Patent No.: US 7,071,646 B1
(45) Date of Patent: Jul. 4, 2006

(54) SENSORLESS MOTOR CONTROL CIRCUIT WITHOUT EMPLOYING ANY MASK PROCESS

(75) Inventors: Chi-Yang Chen, Hsinchu County (TW); Feng-Rurng Juang, Hsinchu (TW)

(73) Assignee: Aimtron Technology Corp., Hsinchu (TW)

( * ) Notice: Subject to any disclaimer, the term of this patent is extended or adjusted under 35 U.S.C. 154(b) by 0 days.

(21) Appl. No.: 11/163,057

(22) Filed: Oct. 3, 2005

(51) Int. Cl.
*H02P 6/18* (2006.01)

(52) U.S. Cl. ..................... 318/439; 318/254

(58) Field of Classification Search ........... 318/138, 318/254, 439, 720–724
See application file for complete search history.

(56) References Cited

U.S. PATENT DOCUMENTS

| | | | |
|---|---|---|---|
| 5,057,753 A * | 10/1991 | Leuthold et al. | 318/254 |
| 5,068,582 A * | 11/1991 | Scott | 318/254 |
| 5,285,135 A * | 2/1994 | Carobolante et al. | 318/254 |
| 5,317,243 A * | 5/1994 | Cameron | 318/254 |
| 5,428,276 A * | 6/1995 | Carobolante et al. | 318/254 |
| 5,517,095 A | 5/1996 | Carobolante et al. | |
| 5,691,856 A * | 11/1997 | Kardash | 360/73.03 |
| 5,909,095 A | 6/1999 | Sakti et al. | |
| 5,929,577 A | 7/1999 | Neidorff et al. | |
| 6,111,372 A | 8/2000 | Nishimura | |
| 6,504,328 B1 | 1/2003 | Gontowski, Jr. | |
| 6,633,145 B1 | 10/2003 | Shao et al. | |
| 6,901,212 B1 * | 5/2005 | Masino | 318/254 |

\* cited by examiner

*Primary Examiner*—Bentsu Ro
(74) *Attorney, Agent, or Firm*—Winston Hsu

(57) ABSTRACT

A motor control circuit includes a detector circuit, a comparator circuit, a sifter circuit, and a driver circuit. The detector circuit is coupled to a plurality of coils of a motor for generating a detection signal. The detection signal is in association with a terminal voltage of a selected-to-be-floated coil of the plurality of coils. Based on comparison between the detection signal and a reference voltage, the comparator circuit generates a comparison signal. The sifter circuit receives in sequence a first-time crossing and a second-time crossing from the comparison signal, and generates an indication signal in response to the second-time crossing. The driver circuit controls a commutation of the motor in response to the indication signal.

20 Claims, 6 Drawing Sheets

SENSORLESS MOTOR CONTROL CIRCUIT WITHOUT EMPLOYING ANY MASK PROCESS

BACKGROUND OF THE INVENTION

1. Field of the Invention

The present invention relates to a sensorless motor control circuit and, more particularly, to a sensorless motor control circuit capable of accurately determining a zero-crossing event of the back electrical motion force (BEMF) of a floated coil without employing any mask process.

2. Description of the Related Art

FIG. 1 is a circuit diagram showing a conventional three-phase motor 11 and a switching circuit 12. The motor 11 has three coils A, B, and C, each of which has a terminal coupled together as a central point N, and another terminal Pa, Pb, or Pc respectively coupled to the switching circuit 12. The switching circuit 12 has three identical pairs of high-side and low-side switches SH1 to SH3 and SL1 to SL3, for making the terminals Pa, Pb, and Pc coupled to a supply voltage source $V_m$, or coupled to a ground potential, or even floated without being coupled to either the supply voltage source $V_m$ or the ground potential.

More specifically, the switching circuit 12 is operated among six phases in sequence so as to complete a rotation cycle, for appropriately channeling the drive current through the three coils A, B, and C so as to effectively drive the motor 11. During the first phase, only are the first high-side switch SH1 and the second low-side switch SL2 turned on such that the terminal Pa of the coil A is coupled to the supply voltage source $V_m$, the terminal Pb of the coil B is coupled to the ground potential, and the terminal Pc of the coil C is floated. As a result, the drive current flows from the supply voltage source $V_m$, through the coils A to B in sequence, finally to the ground potential. During the second phase, only are the first high-side switch SH1 and the third low-side switch SL3 turned on such that the terminal Pa of the coil A is coupled to the supply voltage source $V_m$, the terminal Pb of the coil B is floated, and the terminal Pc of the coil C is coupled to the ground potential. As a result, the drive current flows from the supply voltage source $V_m$, through the coils A to C in sequence, finally to the ground potential. During the third phase, only are the second high-side switch SH2 and the third low-side switch SL3 turned on such that the terminal Pa of the coil A is floated, the terminal Pb of the coil B is coupled to the supply voltage source $V_m$, and the terminal Pc of the coil C is coupled to the ground potential. As a result, the drive current flows from the supply voltage source $V_m$, through the coils B to C in sequence, finally to the ground potential. During the fourth phase, only are the second high-side switch SH2 and the first low-side switch SL1 turned on such that the terminal Pa of the coil A is coupled to the ground potential, the terminal Pb of the coil B is coupled to the supply voltage source $V_m$, and the terminal Pc of the coil C is floated. As a result, the drive current flows from the supply voltage source $V_m$, through the coils B to A in sequence, finally to the ground potential. During the fifth phase, only are the third high-side switch SH3 and the first low-side switch SL1 turned on such that the terminal Pa of the coil A is coupled to the ground potential, the terminal Pb of the coil B is floated, and the terminal Pc of the coil C is coupled to the supply voltage source $V_m$. As a result, the drive current flows from the supply voltage source $V_m$, through the coils C to A in sequence, finally to the ground potential. During the sixth phase, only are the third high-side switch SH3 and the second low-side switch SL2 turned on such that the terminal Pa of the coil A is floated, the terminal Pb of the coil B is coupled to the ground potential, and the terminal Pc of the coil C is coupled to the supply voltage source $V_m$. As a result, the drive current flows from the supply voltage source $V_m$, through the coils C to B in sequence, finally to the ground potential.

In the technical field of the sensorless motor control, the timing of commutation is decided on the basis of information provided by the terminal voltage of the floated coil since the potential difference between the terminal voltage of the floated coil and the central coupling point N is a representative of the BEMF of the floated coil. FIG. 2 is a timing chart showing the voltages at the terminals Pa, Pb, and Pc of the coils A, B, and C. As clearly seen from the figure, an abrupt spike occurs immediately after the coil enters floated because of the inductive nature of the coil. For example, in the case of transitioning from the first phase to the second phase, the current originally flowing through the coil B, which is not allowed to be removed immediately, changes its course to flow through the freewheel diode of the second high-side switch SH2 and back to the supply voltage source $V_m$. Therefore, at the initial period of the second phase, the voltage at the terminal Pb of the coil B makes an abrupt jump higher than the supply voltage source $V_m$ by a forward diode drop. In order to prevent such an abrupt spike at the initial period of coil's floating phase from affecting the determination of the zero-crossing of BEMF, the prior art sensorless motor control circuit intuitively employs a mask circuit to simply disable the comparator circuit at the initial period of coil's floating phase for trying to avoid detecting any of the abrupt spike.

FIG. 3 is a circuit block diagram showing a conventional sensorless motor control circuit 30. A BEMF detector circuit 33 is coupled to the terminals of the coils A, B, and C for sensing the BEMF of the floated coil. A mask circuit 34 is arranged between the BEMF detector circuit 33 and a comparator circuit 35 for preventing the abrupt spike from being delivered to the comparator circuit 35 to cause an erroneous result. Based on the zero-crossing detected by the comparator circuit 35, a drive signal synthesizing circuit 36 generates appropriate drive signals for controlling the high-side and low-side switches of a switching circuit 32 to commutate a motor 31. Moreover, the drive signals may be provided to the mask circuit 34 and the comparator circuit 35, for synchronizing the timing of the mask process with the commutation of the motor 31.

In the prior art, the mask circuit 34 is typically pre-designed with a mask period having a fixed duration, which is presumed long enough for masking all of the abrupt spike at the initial period of coil's floating phase. However, the period of time when the abrupt spike exists actually varies depending on the rotation rate of the motor, the magnitude of the drive current, and other dynamic factors. Even though some of the prior art mask circuits have been improved to provide a mask period having an adaptive length, it is still necessary to choose a particular, fixed rate for adapting the mask period. When the adaptive rate is chosen inappropriately, the abrupt spike may not be completely masked in some cases.

SUMMARY OF THE INVENTION

In view of the above-mentioned problems, an object of the present invention is to provide a sensorless motor control circuit capable of accurately determining a zero-crossing event of the back electrical motion force (BEMF) of a floated coil without employing any mask process.

According to one aspect of the present invention, a motor control circuit is applied to a motor having a plurality of coils, including a detector circuit, a comparator circuit, a sifter circuit, and a drive circuit. The detector circuit is coupled to the plurality of coils for generating a detection signal. The detection signal is in association with a voltage at a terminal of a selected-to-be-floated coil of the plurality of coils. The comparator circuit is coupled to the detector circuit for comparing the detection signal and a reference voltage so as to generate a comparison signal. The sifter circuit is coupled to the comparator circuit for receiving the comparison signal. The sifter circuit receives in sequence a first-time crossing and a second-time crossing of the comparison signal, and generates an indication signal in response to the second-time crossing. The drive circuit controls a commutation of the motor in response to the indication signal.

According to another aspect of the present invention, a motor controlling method is provided for a motor having a plurality of coils. At first, a voltage at a terminal of a selected-to-be-floated coil of the plurality of coils is detected so as to generate a detection signal. The detection signal is compared with a reference voltage so as to generate a comparison signal. The comparison signal presents a first-time crossing and a second-time crossing. Among the first-time crossing and the second-time crossing, the second-time crossing is selected out. An indication signal is generated in response to the second-time crossing. The indication signal is applied to control a commutation of the motor.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
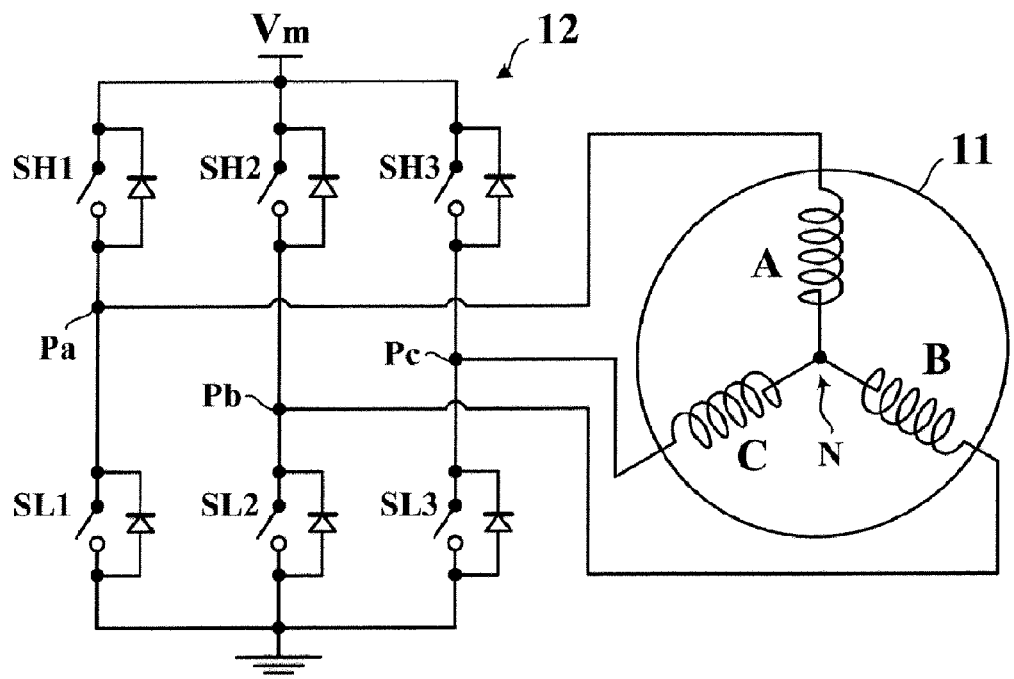
FIG. 1 is a circuit diagram showing a conventional three-phase motor and a switching circuit.
Figure 2:
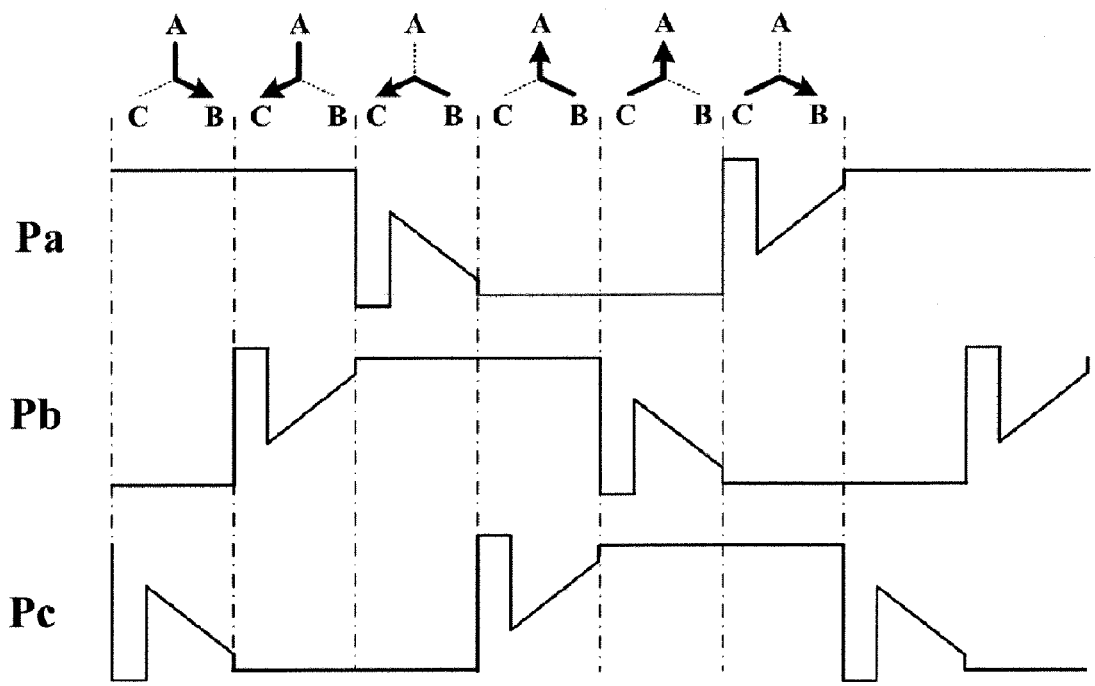
FIG. 2 is a timing chart showing voltages at terminals of coils in a motor.
Figure 3:
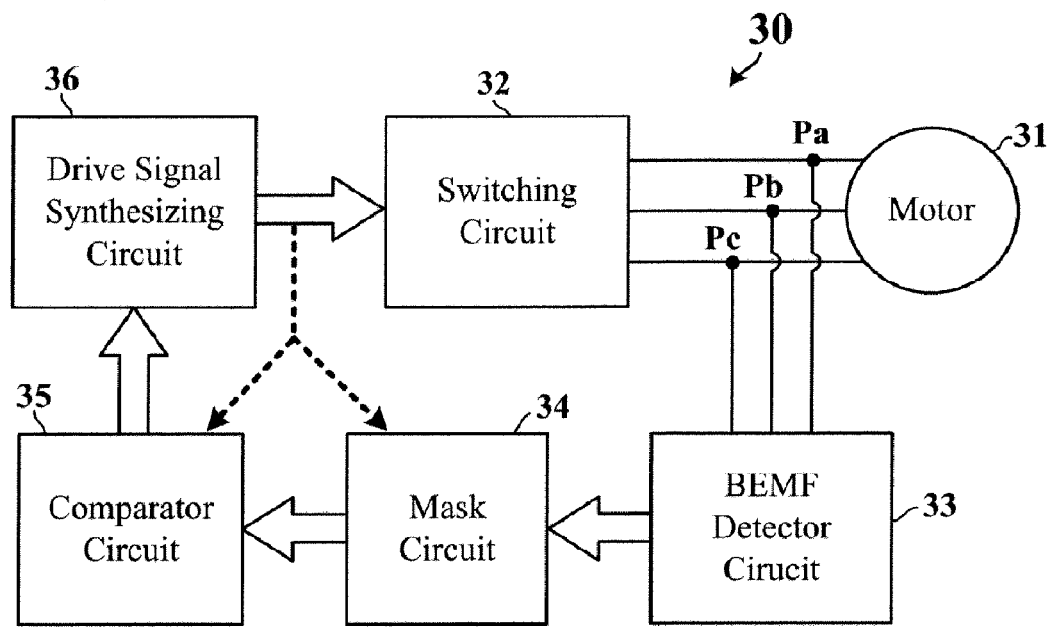
FIG. 3 is a circuit block diagram showing a conventional motor control circuit.
Figure 4:
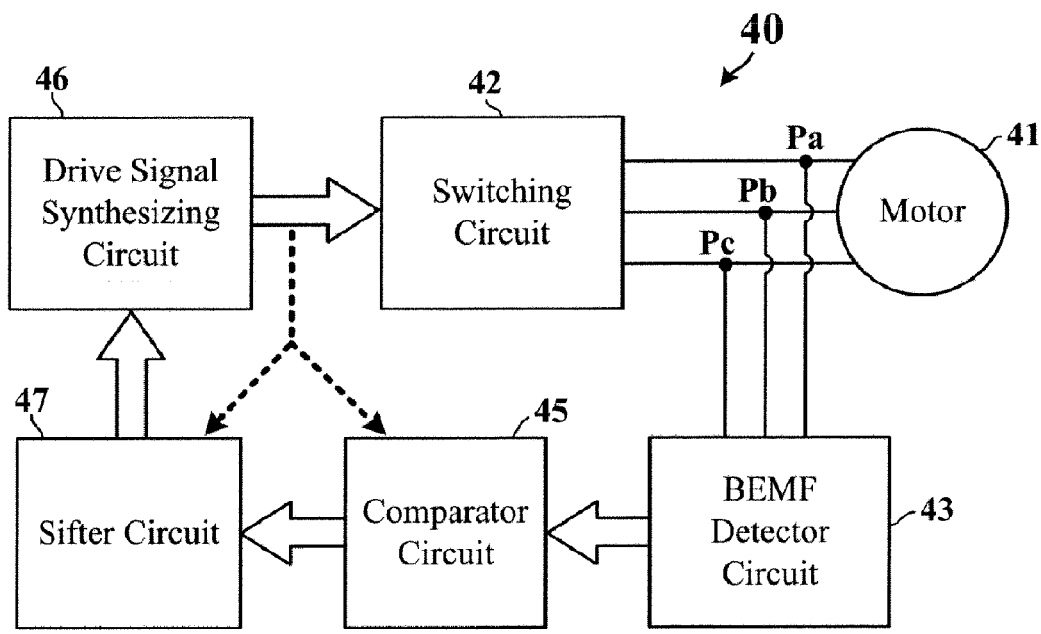
FIG. 4 is a circuit block diagram showing a motor control circuit according to the present invention.

FIG. 4 is a circuit block diagram showing a sensorless motor control circuit 40 according to the present invention. Like the prior art firstly, a BEMF detector circuit 43 is coupled to the terminals Pa, Pb, and Pc of the coils A, B, and C for detecting the BEMF of the floated coil. However in the present invention, the detection signal of the BEMF detector circuit 43 is directly input to a comparator circuit 45 without being masked or corrected by any conventional mask circuit 34. Afterwards, a sifter circuit 47 receives and analyzes the comparison signals of the comparator circuit 45 in order to select a correct zero-crossing event to be applied to control the commutation of a motor 41. Based on the zero-crossing event selected by the sifter circuit 47, a drive signal synthesizing circuit 46 generates and outputs the drive signals to a switching circuit 42, for controlling the commutation of the motor 41. In other words, the prior art mask circuit and method may be categorized as a pre-zero-crossing technique while the sifter circuit and method according to the present invention may be categorized as a post-zero-crossing technique.

Figure 5:
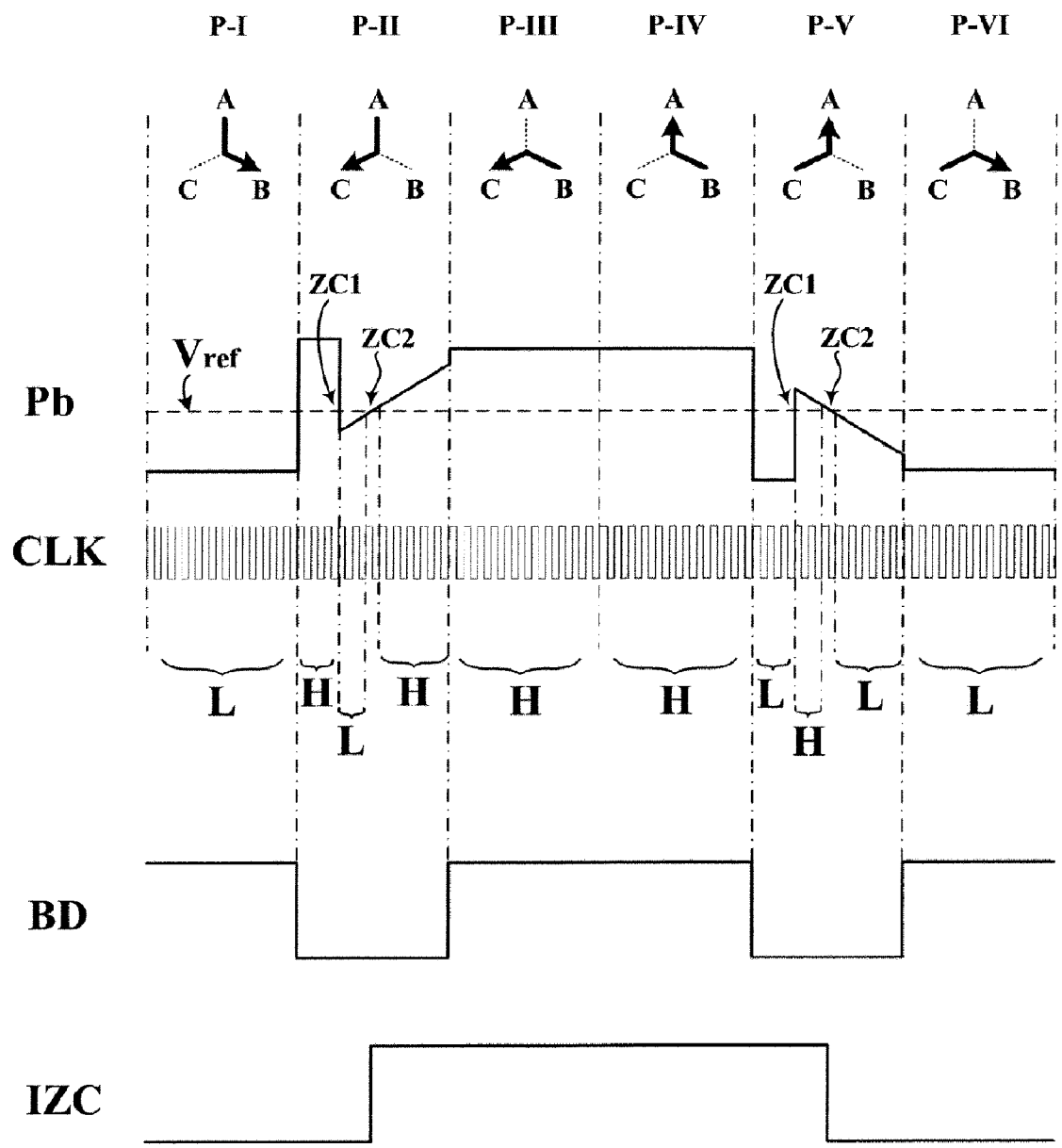
FIG. 5 is a schematic diagram showing an operational principle of a sifter circuit according to the present invention.

FIG. 5 is a schematic diagram showing an operational principle of a sifter circuit 47 according to the present invention. For the sake of simplicity, only is the voltage at the terminal Pb of the coil B exemplified in the figure. Since the coils A and C are operated similarly to the coil B, the detailed descriptions relating to the coil B can be equally applied to the coils A and C without difficulties by the one skilled in the art after understanding the teaching of the present invention. Moreover, the sifter circuit and method according to the present invention are not limited to the exemplary three-phase motor but may be applied to any other multi-phase motors of every kind.

In FIG. 5 is shown the voltage at the terminal Pb of the coil B when the motor 41 stably rotates. During the first and sixth phases P-I and P-VI, the terminal Pb of the coil B is coupled to the ground potential. During the second and fifth phases P-II and P-V, the terminal Pb of the coil B is floated and therefore demonstrates a voltage representative of the BEMF. During the third and fourth phases P-III and P-IV, the terminal Pb of the coil B is coupled to the supply voltage source $V_m$. As described above, at the initial period of the second phase P-II, the voltage at the terminal Pb of the coil B jumps abruptly from the ground potential higher than the supply voltage source $V_m$ by a diode forward drop. Likewise, at the initial period of the fourth phase P-IV, the voltage at the terminal Pb of the coil B dives abruptly from the supply voltage source $V_m$ lower than the ground potential by a diode forward drop.

In the comparator circuit 45, the voltage at the terminal Pb of the coil B is compared with a reference voltage $V_{ref}$. In an example of the linear-driving motor, the reference voltage $V_{ref}$ may be implemented by directly sensing the voltage at the central coupling point N, or by using half the supply voltage source $V_m$ as an approximation. In an example of the pulse-width-modulation-driving motor, the reference voltage $V_{ref}$ may be implemented by an offset voltage disclosed in the U.S. Pat. No. 6,633,145, which is incorporated herein by reference.

Through a careful observation on FIG. 5, the voltage at the terminal Pb of the coil B is found to demonstrate twice the crossing with the reference voltage $V_{ref}$ during each of the second and fifth phases P-II and P-V. Take the second phase P-II as an example, the first-time crossing ZC1 occurs when the voltage at the terminal Pb of the coil B quickly restores below the reference voltage $V_{ref}$ as soon as the inductive current which causes the abrupt spike has been completely removed. Afterwards, the voltage at the terminal Pb of the coil B gradually increases and eventually makes a second-time crossing ZC2 with the reference voltage $V_{ref}$. Therefore, the first-time crossing ZC1 is attributed to the abrupt spike while the second-time crossing ZC2 is the genuine zero-crossing event applicable to the control of commutation. The sifter circuit 47 according to the present invention is designed to select the second-time crossing ZC2 on the recognition that the second-time crossing ZC2 represents the genuine zero-crossing event of the BEMF regardless of the driving method, the rotation rate, and the loading condition. In other words, the sifter circuit 47 receives in sequence the first-time crossing ZC1 and the second-time crossing ZC2 and, only in response to the second-time crossing ZC2, generates an indication signal to trigger the drive signal synthesizing circuit 46. Through the sifter circuit 47, the sensorless motor control circuit 40 according to the present invention eliminates the risk of failing to completely mask the abrupt spike at the initial period of coil's floating phase in the prior art mask process.

Figure 6A:
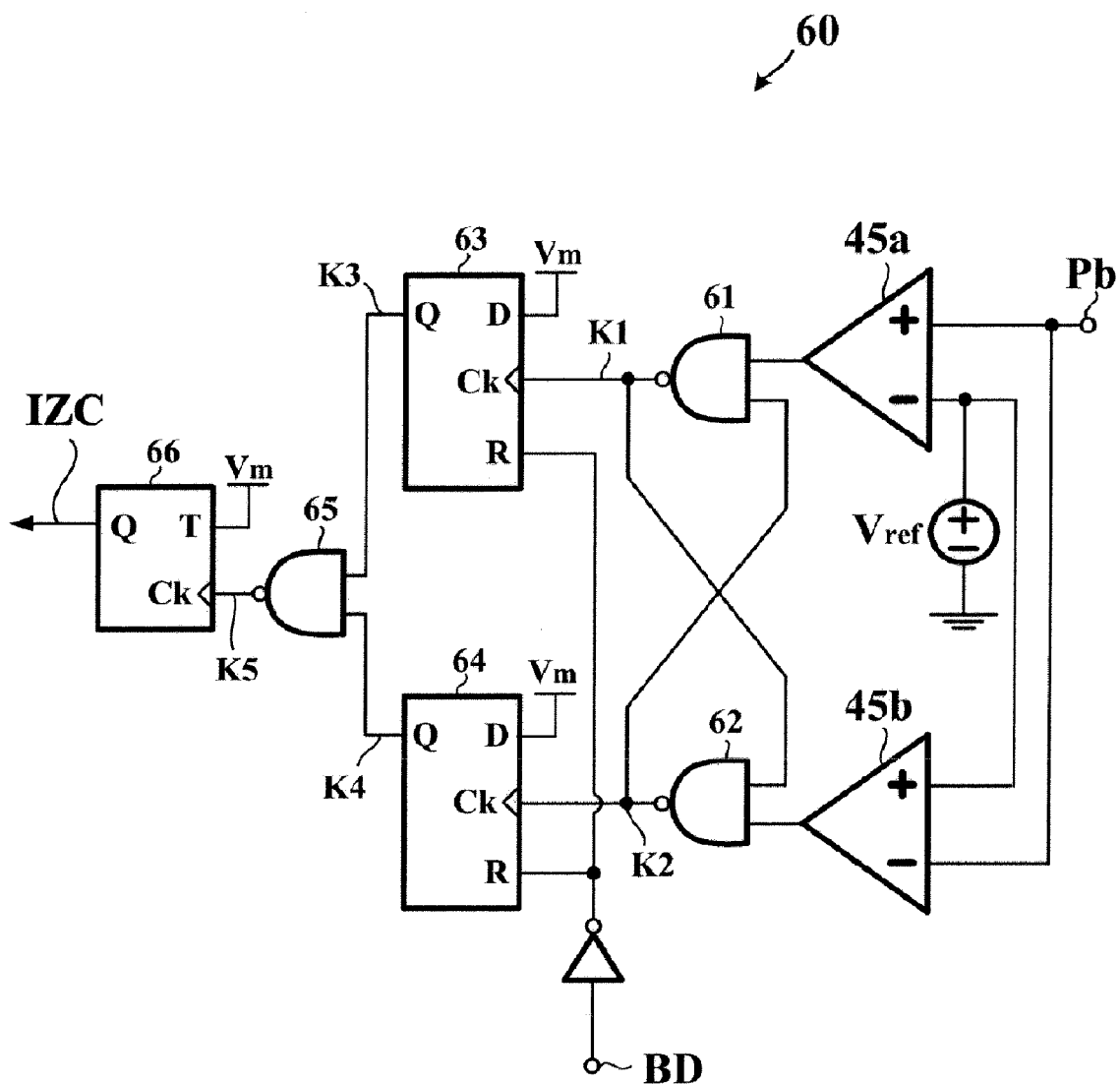
FIG. 6(A) is a detailed circuit diagram showing a first example of a sifter circuit according to the present invention.

FIG. 6(A) is a detailed circuit diagram showing a first example of a sifter circuit 60 according to the present invention. The comparator circuit 45 is implemented by a first comparator 45a and a second comparator 45b, for determining whether the voltage at the terminal Pb of the coil B is larger than or smaller than the reference voltage $V_{ref}$. The first and second comparators 45a and 45b have output signals inverted with respect to each other. NAND logic gates 61 and 62 are cross-coupled to form a latch. The NAND logic gate 61 has an output signal K1 supplied to a clock terminal Ck of a D-type flip flop 63 while the NAND logic gate 62 has an output signal K2 supplied to a clock terminal Ck of a D-type flip flop 64. Reset terminals R of the D-type flip flops 63 and 64 are controlled by an inverted version of a drive signal BD. The drive signal BD may be provided by a drive signal synthesizing circuit 46, wherein the low level of the drive signal BD indicates that the coil B is floated. Through a D-type flip flop 65, output signals K3 and K4 of the D-type flip flops 63 and 64 control a clock terminal Ck of a T-type flip flop 66. Therefore, the T-type flip flop 66 outputs a zero-crossing indication signal IZC to the drive signal synthesizing circuit 46 in order to control the commutation of the motor.

Figure 6B:
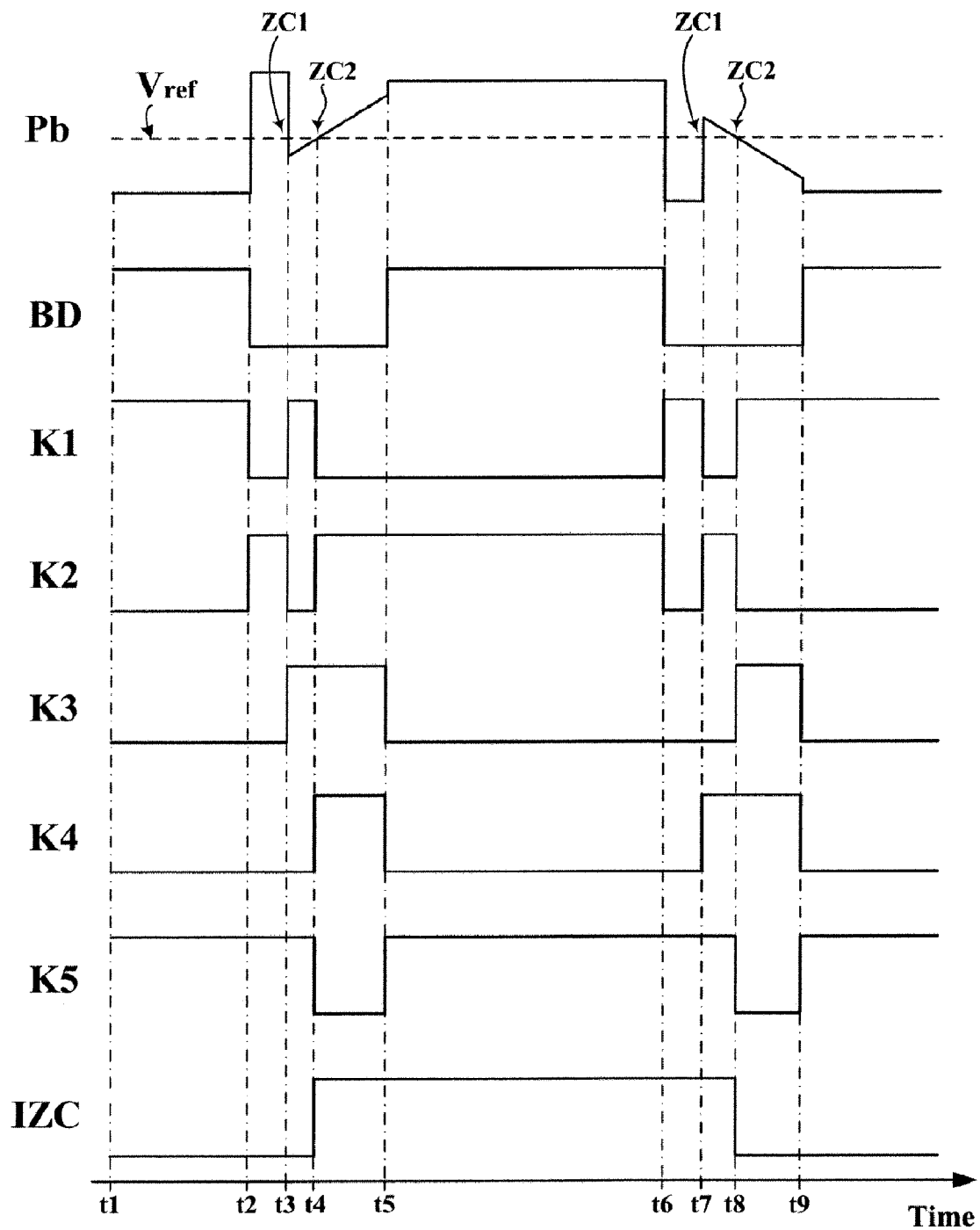
FIG. 6(B) is a waveform timing chart showing an operation of a first example of a sifter circuit according to the present invention.

FIG. 6(B) is a waveform timing chart showing an operation of a first example of a sifter circuit 60 according to the present invention. At time t1, the voltage at the terminal Pb of the coil B is smaller than the reference voltage $V_{ref}$ so the output signal K1 of the NAND logic gate 61 is at the high level while the output signal K2 of the NAND logic gate 62 is at the low level. At time t2, the coil B is floated so the voltage at the terminal Pb abruptly jumps higher than the reference voltage $V_{ref}$. At time t3, the first-time crossing ZC1 occurs such that the output signal K3 of the D-type flip flop 63 transitions to the high level. However, the T-type flip flop 66 is not triggered at this moment because the output signal K4 of the D-type flip flop 64 still stays at the low level. At time t4, the second-time crossing ZC2 occurs such that the output signal K4 of the D-type flip flop 64 transitions to the high level. Now that both of the output signals K3 and K4 are at the high level, the T-type flip flop 66 is triggered to generate the high level of the zero-crossing indication signal IZC. Therefore, the sifter circuit 60 effectively selects out the second-time crossing ZC2 and correctly controls the commutation of the motor. At time t5, the drive signal BD transitions from the low level to the high level for resetting the output signals K3 and K4 of the D-type flip flops 63 and 64 into the low level in order to be ready for next execution of sifting.

At time t6, the coil B is floated so the voltage at the terminal Pb abruptly dives lower than the reference voltage $V_{ref}$. At time t7, the first-time crossing ZC1 occurs such that the output signal K4 of the D-type flip flop 64 transitions to the high level. However, the T-type flip flop 66 is not triggered at this moment because the output signal K3 of the D-type flip flop 63 still stays at the low level. At time t8, the second-time crossing ZC2 occurs such that the output signal K3 of the D-type flip flop 63 transitions to the high level. Now that both of the output signals K3 and K4 of the D-type flip flops 63 and 64 are at the high level, the T-type flip flop 66 is triggered to generate the low level of the zero-crossing indication IZC. Therefore, the sifter circuit 60 effectively selects out the second-time crossing ZC2 and correctly controls the commutation of the motor. At time t9, the drive signal BD transitions from the low level to the high level for resetting the output signals K3 and K4 of the D-type flip flops 63 and 64 in order to be ready for next execution of sifting.

Figure 7:
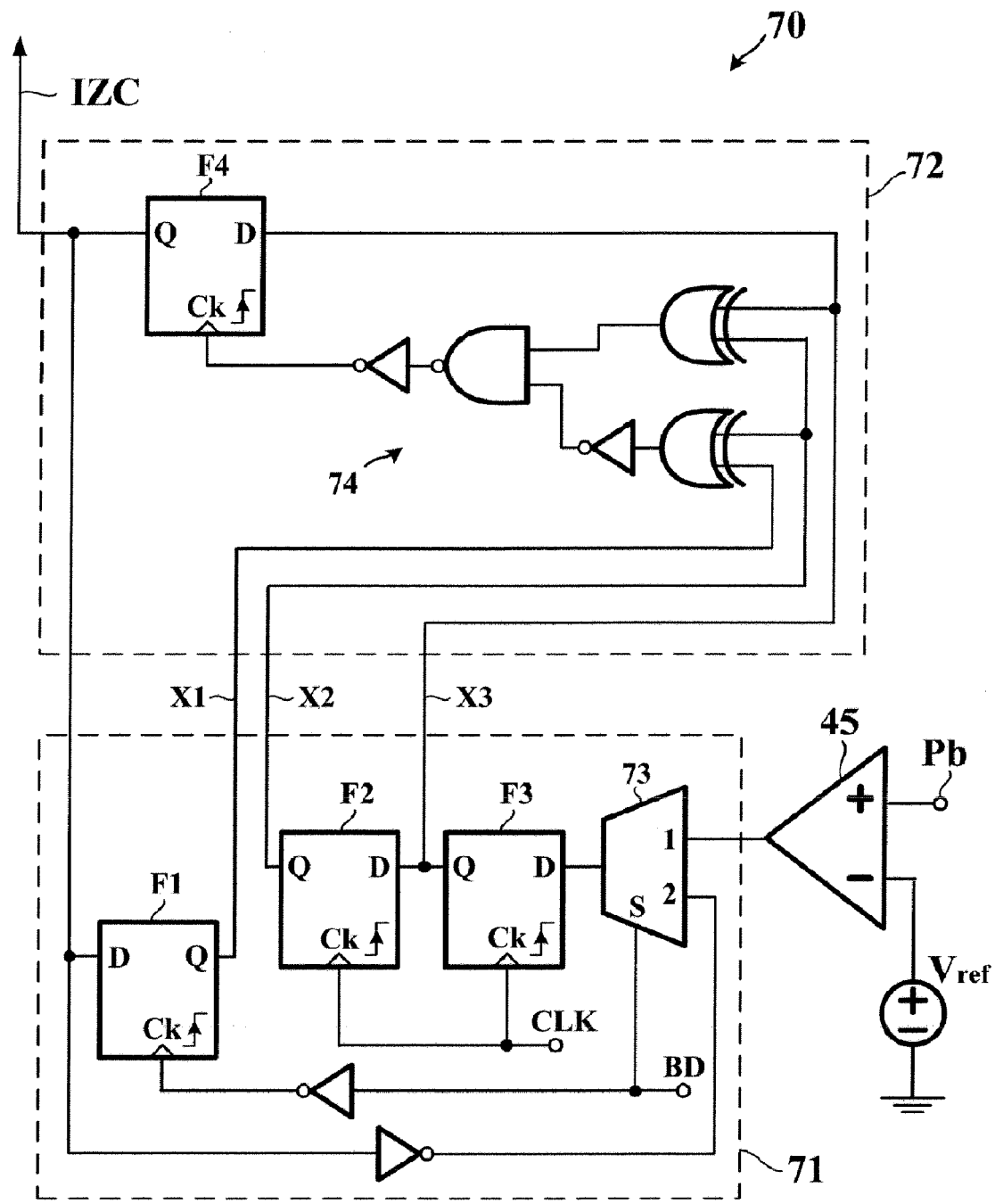
FIG. 7 is a detailed circuit diagram showing a second example of a sifter circuit according to the present invention.

FIG. 7 is a detailed circuit diagram showing a second example of a sifter circuit 70 according to the present invention. The sifter circuit 70 of the second example primarily includes a sample-and-record circuit 71 and a sample set analysis circuit 72. In accordance with a predetermined clock signal CLK, the sample-and-record circuit 71 samples and records the comparison signal of the comparator circuit 45, thereby forming a three-element sample set [X1, X2, X3]. Afterwards, through analyzing the sample set [X1, X2, X3], the sample set analysis circuit 72 selects out the second-time crossing ZC2 to be applied to control the commutation of the motor. It should be noted that in the example of the linear-driving motor, a higher frequency of the clock signal CLK produces a denser set of samples and therefore enhances the precision of sifting. In the example of the pulse-width-modulation-driving motor, the clock signal CLK may be implemented directly by the pulse width modulation clock signal.

In a first step, which is immediately before the coil B is floated, the sample-and-record circuit 71 records a first element X1 by sampling the comparison signal of the comparator circuit 45, which compares the voltage at the terminal Pb of the coil B with the reference voltage $V_{ref}$. In a second step, which is during the coil B is floated, the sample-and-record circuit 71 sequentially records the second element X2 and the third element X3 at two consecutive periods of the clock signal CLK by sampling the comparison signal of the comparator circuit 45. As a result, the sample-and-record circuit 71 forms the three-element sample set [X1, X2, X3]. In a third step, the sample set analysis circuit 72 determines whether or not the sample set [X1, X2, X3] matches any of arrangements [L, L, H] and [H, H, L] wherein L refers to the low level and H refers to the high level. If unmatched, the second step will be repeated to refresh the second and third elements X2 and X3 in accordance with the clock signal CLK. It should be noted that the first element X1 is maintained the same as originally recorded in the first step. Once the sample set [X1, X2, X3] matches any of the arrangements [L, L, H] and [H, H, L], the sample set analysis circuit 72 interprets that the second-time crossing ZC2 just occurred.

The sifting method in the second example can be verified by referring back to the FIG. 5. As shown in FIG. 5, assumed that the coil B is coupled to the ground potential immediately before floated, i.e. during the first phase P-I, the sample-and-record circuit 71 records in the first step the low level L as the first element X1. During the second phase P-II when the coil B is floated, the first-time crossing ZC1 occurs when the voltage at the terminal Pb of the coil B falls down through the reference voltage $V_{ref}$. Consequently, the second element X2 recorded immediately before the first-time crossing ZC1 is the high level H while the third element X3 recorded immediately after the first-time crossing ZC1 is the low level L. However, the second-time crossing ZC2 occurs when the voltage at the terminal Pb of the coil B rises up through the reference voltage $V_{ref}$. Consequently, the second element X2 recorded immediately before the second-time crossing ZC2 is the low level L while the third element X3 recorded immediately after the second-time crossing ZC2 is the high level H. Therefore, during the second phase P-II the second-time crossing ZC2 can be effectively identified by analyzing whether the sample set [X1, X2, X3] matches the arrangement [L, L, H] or not.

Likewise, assumed that the coil B is coupled to the supply voltage source $V_m$ immediately before floated, i.e. during the fourth phase P-IV, the sample-and-record circuit 71 records in the first step the high level H as the first element X1. During the fifth phase P-V when the coil B is floated, the first-time crossing ZC1 occurs when the voltage at the terminal Pb of the coil B rises up through the reference voltage $V_{ref}$. Consequently, the second element X2 recorded immediately before the first-time crossing ZC1 is the low level L while the third element X3 recorded immediately after the first-time crossing ZC1 is the high level H. However, the second-time crossing ZC2 occurs when the voltage at the terminal Pb of the coil B falls down through the reference voltage $V_{ref}$. Consequently, the second element X2 recorded immediately before the second-time crossing ZC2 is the high level H while the third element X3 recorded immediately after the second-time crossing ZC2 is the low level L. Therefore, during the fifth phase P-V the second-time crossing ZC2 can be effectively identified by analyzing whether the sample set [X1, X2, X3] matches the arrangement [H, H, L] or not.

Referring again to FIG. 7, the sample-and-record circuit 71 primarily includes a multiplexer 73 and three D-type flip flops F1 to F3. A drive signal BD is applied to a selection terminal S of the multiplexer 73 and, after inverted, to a clock terminal Ck of the D-type flip flop F1. The drive signal BD may be provided by the drive signal synthesizing circuit 46, wherein the low level of the drive signal BD indicates that the coil B is floated. When the drive signal BD is at the high level, the multiplexer 73 allows the zero-crossing indication signal IZC to pass through. When the drive signal BD is at the low level, the multiplexer 73 allows the comparison signal of the comparator circuit 45 to pass through. In accordance with the drive signal BD, the D-type flip flop F1 records the first element X1 immediately before the coil is floated. In accordance with the clock signal CLK, the D-type flip flops F1 and F3 record in sequence the second and third elements X2 and X3 such that the second element X2 is just one period of the clock signal CLK earlier than the third element X3. The sample set analysis circuit 72 primarily includes a logic circuit 74 and a D-type flip flop F4. The first to third elements X1 and X3 are analyzed in the logic circuit 74 to determine whether or not they match any of the arrangements [L, L, H] and [H, H, L]. In other words, once it is identified that the first element X1 is identical to the second element X2 and the second element X2 is different from the third element X3, the output signal of the logic circuit 74 transitions from the low level to the high level, indicating the occurrence of the second-time crossing ZC2. Since the output of the logic circuit 74 is applied to a clock terminal Ck of the D-type flip flop F4, the D-type flip flop F4 is triggered to transition the zero-crossing indication signal IZC each time when the logic circuit 74 identifies the occurrence of the second-time crossing ZC2. Therefore, the sifter circuit 70 effectively selects out the second-time crossing ZC2 and correctly controls the commutation of the motor.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A motor control circuit applied to a motor having a plurality of coils, comprising:
    a detector circuit coupled to the plurality of coils for generating a detection signal representative of a voltage at a terminal of a selected-to-be-floated coil of the plurality of coils;
    a comparator circuit coupled to the detector circuit for comparing the detection signal and a reference voltage so as to generate a comparison signal;
    a sifter circuit coupled to the comparator circuit for receiving in sequence a first-time crossing and a second-time crossing of the comparison signal, and for generating an indication signal in response to the second-time crossing; and
    a drive circuit for controlling a commutation of the motor in response to the indication signal.

2. The circuit according to claim 1, wherein:
    the comparison signal has a first state and a second state, the first state representing that the detection signal is higher than the reference voltage, and the second state representing that the detection signal is lower than the reference voltage.

3. The circuit according to claim 2, wherein:
    the first-time crossing relates to a transition of the comparison signal from the first state to the second state, and the second-time crossing relates to a transition of the comparison signal from the second state to the first state.

4. The circuit according to claim 2, wherein:
    the first-time crossing relates to a transition of the comparison signal from the second state to the first state, and the second-time crossing relates to a transition of the comparison signal from the first state to the second state.

5. The circuit according to claim 1, wherein:
    the reference voltage is generated by sensing a voltage at a central coupling terminal of the plurality of coils.

6. The circuit according to claim 1, wherein:
    the reference voltage is implemented by a predetermined voltage.

7. The circuit according to claim 1, wherein:
    the sifter circuit includes:
        a sample-and-record circuit for sampling the comparison signal in accordance with a predetermined clock signal and recording a first element, a second element, and a third element, wherein the first element is sampled and recorded before the selected-to-be-floated coil is floated, and the second and third elements are sampled and recorded after the selected-to-be-floated coil is floated, and
        an analysis circuit for analyzing the first element, the second element, and the third element so as to select out the second-time crossing.

8. The circuit according to claim 7, wherein:
the third element is sampled and recorded at a current period of the clock signal, and the second element is sampled and recorded at a period prior to the current period.

9. The circuit according to claim 7, wherein:
the analysis circuit selects out the second-time crossing based on a criterion that the first element is identical to the second element and the second element is different from the third element.

10. The circuit according to claim 1, wherein:
the drive circuit includes a drive signal synthesizing circuit and a switching circuit.

11. A motor controlling method applied to a motor having a plurality of coils, comprising:
detecting a voltage at a terminal of a selected-to-be-floated coil of the plurality of coils so as to generate a detection signal;
comparing the detection signal with a reference voltage so as to generate a comparison signal, wherein the comparison signal presents a first-time crossing and a second-time crossing;
selecting out the second-time crossing among the first-time crossing and the second-time crossing;
generating an indication signal in response to the second-time crossing; and
controlling a commutation of the motor in response to the indication signal.

12. The method according to claim 11, wherein:
the comparison signal has a first state and a second state, the first state representing that the detection signal is higher than the reference voltage, and the second state representing that the detection signal is lower than the reference voltage.

13. The method according to claim 12, wherein:
the first-time crossing relates to a transition of the comparison signal from the first state to the second state, and the second-time crossing relates to a transition of the comparison signal from the second state to the first state.

14. The method according to claim 12, wherein:
the first-time crossing relates to a transition of the comparison signal from the second state to the first state, and the second-time crossing relates to a transition of the comparison signal from the first state to the second state.

15. The method according to claim 11, wherein:
the step of selecting out the second-time crossing includes:
sampling the comparison signal in accordance with a predetermined clock signal and recording a first element, a second element, and a third element, wherein the first element is sampled and recorded before the selected-to-be-floated coil is floated, and the second and third elements are sampled and recorded after the selected-to-be-floated coil is floated, and
selecting out the second-time crossing based on a criterion that the first element is identical to the second element and the second element is different from the third element.

16. The method according to claim 15, wherein:
the third element is sampled and recorded at a current period of the clock signal, and the second element is sampled and recorded at a period prior to the current period.

17. A zero-crossing detection circuit for controlling a commutation of a motor, comprising:
a first circuit for generating a first signal representative of a back electrical motion force of a floated coil of the motor;
a second circuit for comparing the first signal with a reference voltage so as to generate a second signal, wherein the second signal presents a first-time crossing and a second-time crossing; and
a third circuit for receiving in sequence the first-time crossing and the second-time crossing, and generating a third signal in response to the second-time crossing, wherein the third signal is applied to control the commutation of the motor.

18. The circuit according to claim 17, wherein:
the comparison signal has a first state and a second state, the first state representing that the detection signal is higher than the reference voltage, and the second state representing that the detection signal is lower than the reference voltage.

19. The circuit according to claim 18, wherein:
the first-time crossing relates to a transition of the comparison signal from the first state to the second state, and the second-time crossing relates to a transition of the comparison signal from the second state to the first state.

20. The circuit according to claim 18, wherein:
the first-time crossing relates to a transition of the comparison signal from the second state to the first state, and the second-time crossing relates to a transition of the comparison signal from the first state to the second state.

* * * * *